(12) United States Patent
Lawson

(10) Patent No.: US 6,636,821 B2
(45) Date of Patent: Oct. 21, 2003

(54) OUTPUT DRIVER IMPEDANCE CALIBRATION CIRCUIT

(75) Inventor: William F. Lawson, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 174 days.

(21) Appl. No.: 09/898,252

(22) Filed: Jul. 3, 2001

(65) Prior Publication Data

US 2003/0009304 A1 Jan. 9, 2003

(51) Int. Cl.[7] .............................................. H03K 19/003
(52) U.S. Cl. .............................. 702/107; 702/65; 326/30
(58) Field of Search ........................... 702/107, 64, 65, 702/85, 117, 124, 126, 189, 193, FOR 171, FOR 103–FOR 106, FOR 156–FOR 163, FOR 134; 326/30, 87, 83, 82, 86, 27, 21, 32, 34, 57; 327/108, 112, 566; 324/601; 307/98, 412; 333/32

(56) References Cited

U.S. PATENT DOCUMENTS

| | | | |
|---|---|---|---|
| 5,559,441 A | 9/1996 | Desroches | 324/647 |
| 5,657,456 A | 8/1997 | Gist et al. | 710/100 |
| 6,031,385 A | 2/2000 | Ilkbahar | 324/763 |
| 6,051,995 A | 4/2000 | Pollachek | 326/87 |
| 6,064,224 A | 5/2000 | Esch, Jr. et al. | 326/30 |
| 6,118,310 A * | 9/2000 | Esch, Jr. | 327/108 |
| 6,133,749 A * | 10/2000 | Hansen et al. | 326/30 |
| 6,268,750 B1 * | 7/2001 | Esch, Jr. | 327/170 |
| 6,281,687 B1 * | 8/2001 | Shepston | 324/601 |
| 6,333,639 B1 * | 12/2001 | Lee | 326/30 |
| 6,448,811 B1 * | 9/2002 | Narendra et al. | 326/82 |
| 6,456,124 B1 * | 9/2002 | Lee et al. | 327/108 |
| 6,509,757 B1 * | 1/2003 | Humphrey | 326/30 |

* cited by examiner

*Primary Examiner*—Hal Wachsman
(74) *Attorney, Agent, or Firm*—Scully, Scott, Murphy & Presser; William H. Steinberg, Esq.

(57) ABSTRACT

An output driver impedance calibration circuit which is used to make I/O (input/output) off chip driver characteristics, for a plurality of output driver circuits, alike on the same chip. The output impedance of an input/output driver circuit is calibrated by providing an external target impedance reference (it could be a multiple of the actual target output impedance), multiple devices in the output stage of the I/O driver circuit, a circuit to determine the value of the actual output impedance as compared with its target output impedance and a determination of when to stop the calibration process.

14 Claims, 4 Drawing Sheets

OUTPUT DRIVER IMPEDANCE CALIBRATION CIRCUIT

BACKGROUND OF THE INVENTION

1. Field of the Invention

The present invention relates generally to an output driver impedance calibration circuit, and more particularly pertains to an output driver impedance calibration circuit which is used to make a plurality of I/O (input/output) off chip driver characteristics, for a plurality of output driver circuits, alike on the same chip within a tighter tolerance than is otherwise obtainable in the prior art.

2. Discussion of the Prior Art

Integrated circuit communication, chip to chip, relies upon good input-output (I/O) signal integrity. One significant characteristic of an I/O driver circuit that affects the input-output (I/O) signal integrity is its output impedance with respect to the signal line impedance at the system card level. Also, variations of both the I/O driver circuit impedance and the card impedance often become limiting factors in attaining high speed chip to chip communications with good signal integrity. In general, to maximize the transfer of power in a signal, the output impedance of an output driver circuit should match the input impedance of the transmission media connected to the output driver circuit, such as an electrical cable or another circuit or card.

Three major factors which result in variations of the output impedance of an I/O driver circuit are the process technology itself, along with the operating temperature range and the voltage range for the system. Without attempting to control these factors through some calibration scheme, variations in the output impedance with current state-of-the-art CMOS technology with a 100 degree centigrade system operation specification, would generally be no less than +/−18.5% of a 50 ohm target output impedance for an output driver. This variation generally increases as the target output impedance decreases. The effect of the output impedance of an I/O driver circuit on signal integrity of a system is even more important when the magnitude of the output signal swing becomes smaller, as is the trend in the industry.

SUMMARY OF THE INVENTION

Accordingly, it is a primary object of the present invention to provide an output driver impedance calibration circuit.

A further object of the subject invention is the provision of an output driver impedance calibration circuit which can be used to make a plurality of I/O off chip driver characteristics, for a plurality of output driver circuits, alike on the same chip and within a tighter tolerance than is otherwise obtainable in the prior art. One chip might typically have hundreds or thousands of output driver circuits.

To calibrate the output impedance of an input/output driver circuit requires at a minimum:

- an external target impedance reference (it could be a multiple of the actual target output impedance);
- multiple devices in the output stage of the I/O driver circuit;
- a circuit to determine the value of the actual output impedance as compared with its target output impedance;
- a scheme to determine when to stop the calibration process.

With these four elements in a calibration process, the I/O impedance can typically be controlled to a +/−6.6% tolerance or better, and significantly benefits the signal integrity of the overall I/O interface.

The calibration circuit is self contained and only requires core logic to toggle a UPDT (update) input at any time a recalibration is required to be updated, for example after a large change in temperature.

The advantages of this approach to calibration are:

- no significant/elaborate additional logic is required to operate the calibration;
- the number of additional devices in the output stage is easily changed if different tolerances are desired;
- the calibration can be performed for both the pull-down circuit and the pull-up circuit at one time, or could be split, and a direct calibration performed separately for each of the pull-down circuit and the pull-up circuit.

The present invention differs from the prior art in that the output device is not binarily weighted, and a logic core macro is used together with an I/O calibration cell to determine when the calibration process is completed, and is self contained in just the I/O calibration cell.

BRIEF DESCRIPTION OF THE DRAWINGS

The foregoing objects and advantages of the present invention for an output driver impedance calibration circuit may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE DRAWINGS

Figure 1:
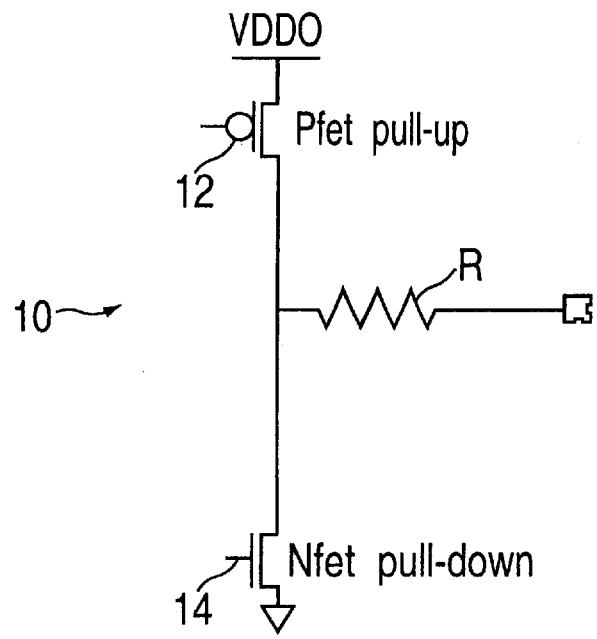
FIG. 1 illustrates a typical prior art CMOS output driver stage which comprises a PFET pull-up transistor base device, an NFET pull-down transistor base device, and an output resistor R leading to an output node PAD.

FIG. 1 illustrates a typical prior art CMOS output driver stage 10 such as may be incorporated, for example, in an ASIC chip. The CMOS output driver stage is connected between a chip power supply VDDO and ground, and comprises a PFET pull-up transistor output device 12, an NFET pull-down transistor output device 14, and an optional output resistor R leading to an output node PAD.

Figure 2:
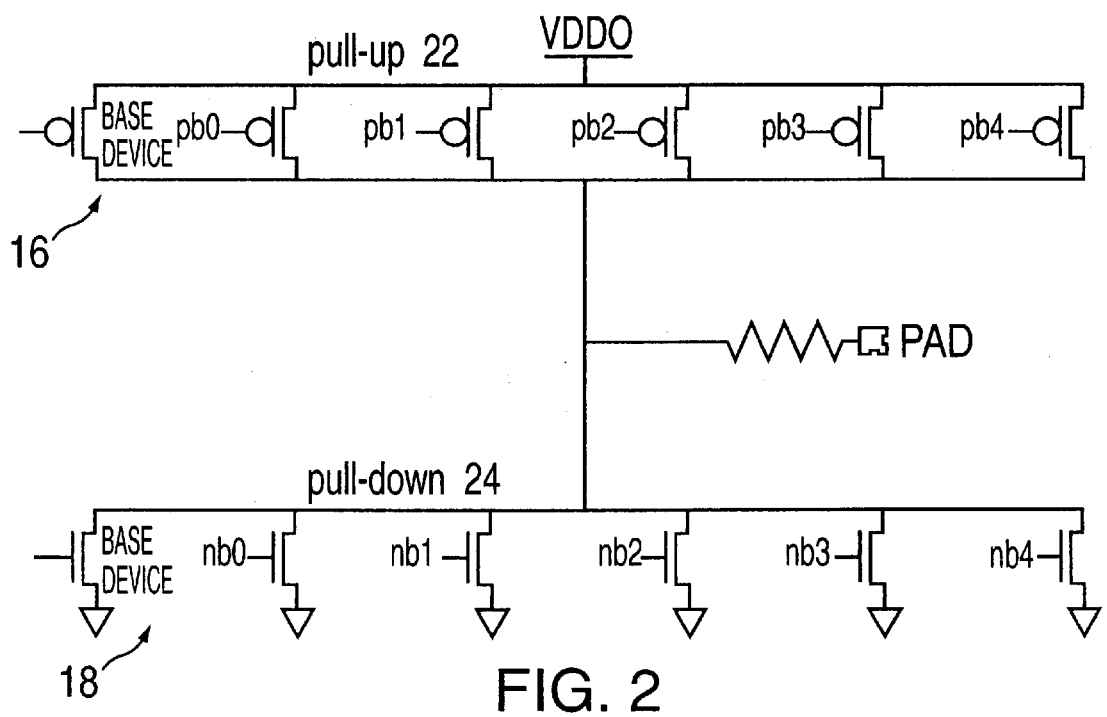
FIG. 2 shows a CMOS output driver stage pursuant to the present invention wherein a total of 5 devices have been added to each of the PFET pull-up transistor base device and the NFET pull-down transistor base device.

In order to obtain a calibrated output impedance for the CMOS output driver stage shown in FIG. 1, the circuit must be modified to accommodate the range of impedances desired over the process, voltage and temperature ranges of operation. Pursuant to the present invention, this is accomplished by adding additional calibration transistor devices to the output stage, as illustrated in FIG. 2, which are then used in a calibration process as described below. Each added transistor device reduces the output impedance of the output driver by an increment when it is turned on or activated, to provide a plurality of different incremental changes in the output impedance of the output driver as a selected number of the transistor devices are activated.

FIG. 2 shows a CMOS output driver stage 20 pursuant to the present invention wherein a total of 5 transistor devices have been added to each of the PFET pull-up transistor base device 16 in pull-up stage 22 and the NFET pull-down transistor base device 18 in pull-down stage 24. Five additional transistor devices are shown for illustrative purposes, but the actual number of added transistor devices could be more or less depending upon the requirements of the I/O interface. The sizes of these added devices are chosen based upon the desired increment of output impedance change as the adjacent devices are turned on or off. Every output driver on the chip that is calibrated requires an identical output stage as shown in FIG. 2.

Figure 3:
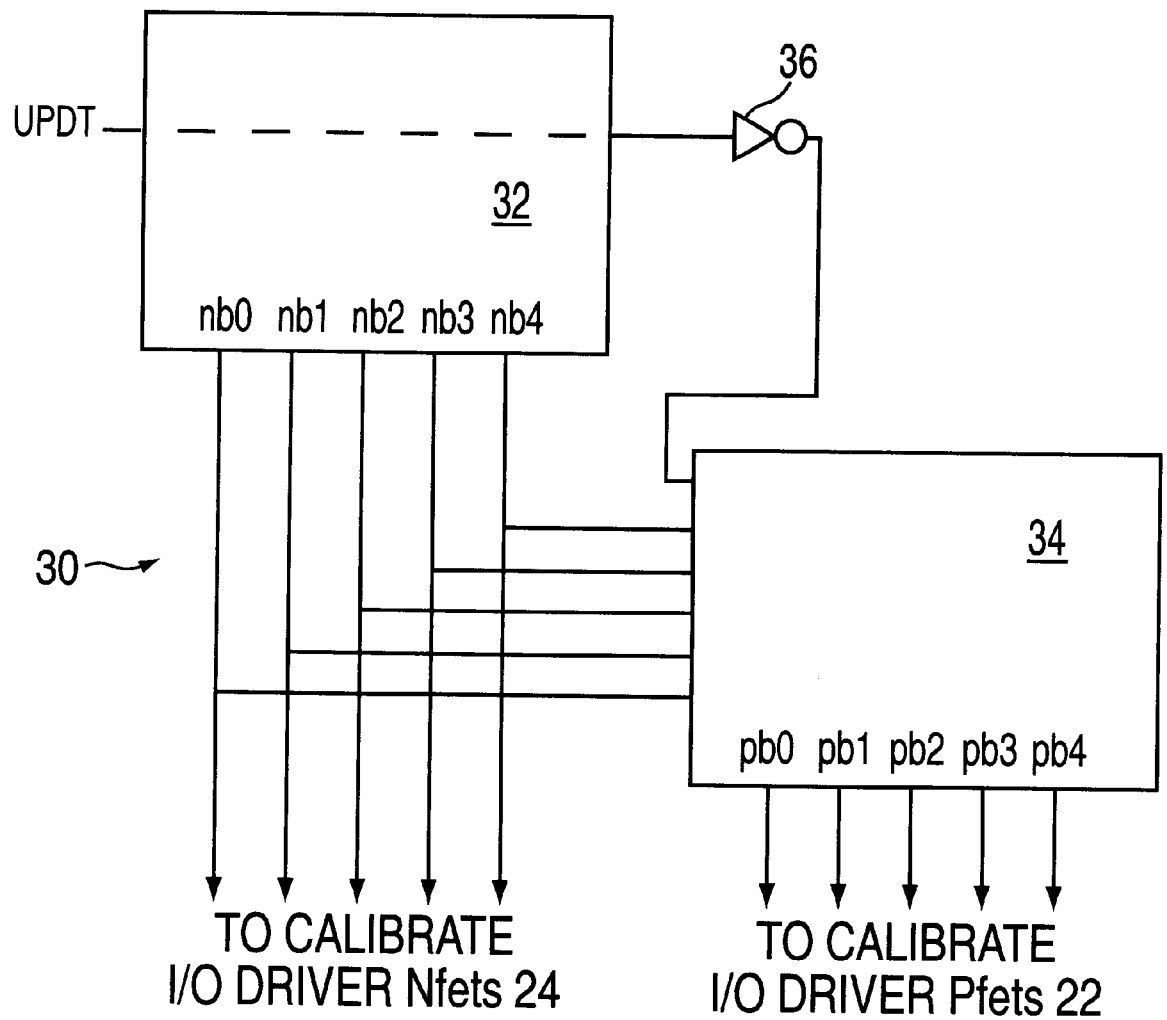
FIG. 3 is an impedance calibration circuit block diagram which illustrates the manner in which the present invention calibrates the impedance of each of the pull-up transistor devices and the pull-down transistor devices at a high level.

FIG. 3 is a block diagram of an impedance calibration circuit 30 which illustrates the manner in which the present invention calibrates the impedance of each of the pull-up transistor devices and the pull-down transistor devices at a high level. In FIG. 3, a UPDT (update) input signal is applied as an input to start the calibration process. This signal propagates through a series of delay elements (see FIG. 4) in the pull-down calibration circuit 32 and turns on in sequence each of the transistor devices in the pull-down stage, and is then passed through an inverter 36, and is then fed to the pull-up calibration circuit 34 where it also propagates through a series of delay elements (see FIG. 5) and turns on in sequence the transistor devices in the pull-up calibration circuit 34. Once the signal has propagated through the series of delay elements in each of the pull-down and pull-up calibration circuits 32 and 34, the state of calibration is then available to all of the I/O driver Nfet and Pfet circuits on the same chip which require a calibrated output and have the same output impedance to within a desired tolerance.

Figure 4:
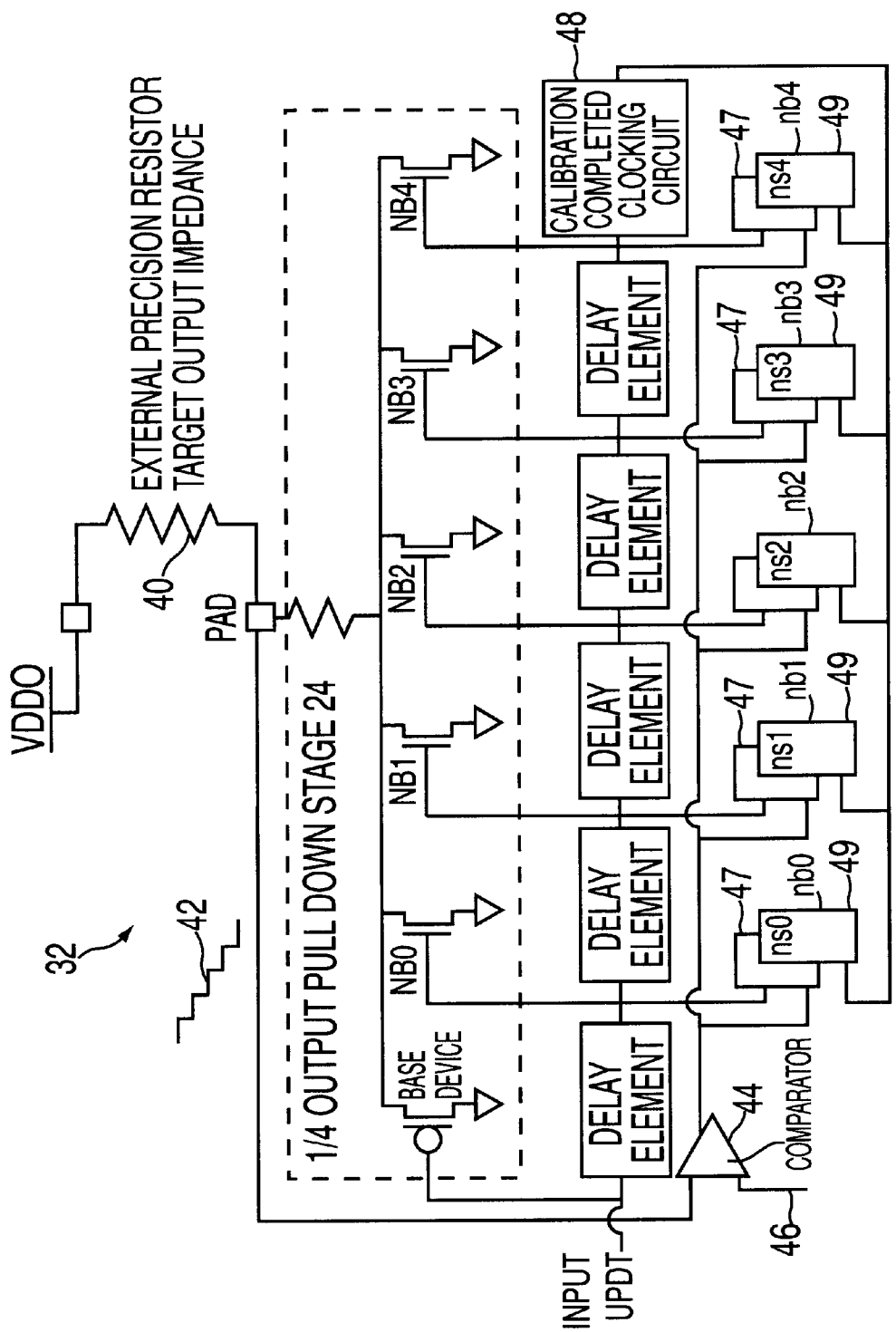
FIG. 4 illustrates details of the pull-down calibration circuit.

FIG. 4 illustrates details of the pull-down calibration circuit 32. In FIG. 4, a UPDT input signal is fed as an input to the circuit. An external precision resistor 40 is used to provide a target impedance to the calibration circuit, and completes a circuit current path from the output power supply (VDDO) on the chip, through the external precision resistor 40, through the conducting transistor devices in the output stage 24 on the chip, to the chip ground. The external precision resistor 40 forms a voltage divider circuit with the conducting transistor devices in the output stage. In one embodiment, the target impedance 40 to the calibration circuit is 4 times larger than the desired impedance (e.g. 200 Ω=4×50 Ω). A ¼ sized output pull-down stage is used to match the 4× target resistance, such that 4 output stages operate together to provide a desired 50 Ω output impedance.

In the pull-down calibration stage 32, the input signal UPDT is propagated through the series of delay elements and turns on, in sequence, each of the output devices (base transistor device, and transistor devices having a gate receiving a signal of nb0, nb1, nb2, nb3, nb4). As this signal is propagated through the delay elements and turns on the transistor devices in sequence, because of the voltage divider arrangement, the output voltage at the node PAD in FIG. 4 changes in a monotonically decreasing (staircase) fashion, as illustrated by waveform 42. This voltage is used as a first input to an analog comparator 44 whose second input is a calibrated voltage 46, which is the voltage at which the ¼ output pull-down stage is within a desired tolerance of the target external precision resistor.

When the comparator output switches (or changes state), which is when the output pull-down stage is within a desired tolerance of the target external precision resistor, the gate voltage states (0 or 1) are captured in a first set of latches 47, one for each output device gate. After the UPDT signal has finished propagating through the last delay element, a calibration completed clocking circuit 48 causes the states of the latches to be transferred to a second set of latches 49, and are also transferred as outputs nb0, nb1, nb2, nb3, nb4 to the gates of the transistor devices in all of the other calibrated output pull-down circuits 24 on the same chip.

Figure 5:
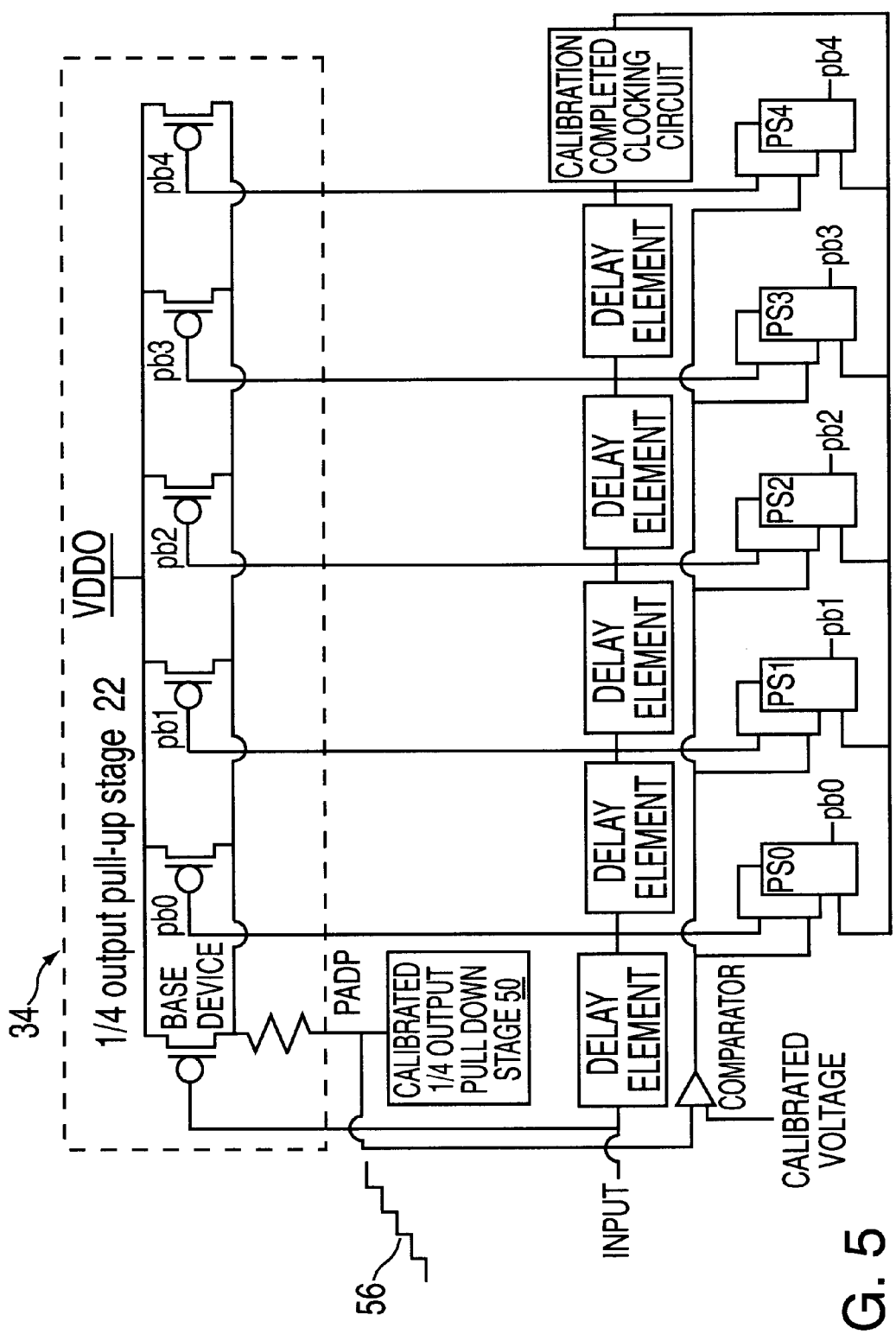
FIG. 5 illustrates details of the pull-up calibration circuit.

The pull-up calibration stage 34 is shown in FIG. 5, and is calibrated in a fashion similar to the pull-down stage as, described previously. The differences are, as shown in FIGS. 3, 4 and 5, the input signal to the PFET stage is inverted by inverter 36 in FIG. 3, and a calibrated ¼ pull-down stage 50, FIG. 5, is used as the target impedance, as opposed to the external precision resistor 40, FIG. 4. The internal node PADP is used as the first input to the comparator 52, and a calibrated voltage 54 is provided as the second input to the comparator. As the input signal is propagated through the delay elements and turns on the transistor devices in sequence, because of the voltage divider arrangement, the output voltage at the node PADP in FIG. 5 changes in a monotonically increasing (staircase) fashion, as illustrated by waveform 56. The latching functions in the same manner as in the pull-down calibration circuit 32.

The calibration can be performed for both the pull-down circuit and the pull-up circuit at one time as shown in FIG. 3, or could be split, and a direct calibration performed separately for each of the pull-down circuit and the pull-up circuit, with each being provided with a separate UPDT input signal.

The calibration circuit is self contained and only requires core logic to toggle a UPDT input at any time a recalibration is required, for example after a large change in temperature.

The advantages of this approach to calibration are:
  no significant/elaborate additional logic is required to operate the calibration;
  the number of additional devices in the output stage is easily changed if different tolerances are desired;
  the calibration circuit can be split, and a direct calibration can be performed for each of the pull-down circuit and the pull-up circuit.

In alternative embodiments, the output stage design can also take advantage of scaling the devices to obtain other impedances by using the calibrated output bits. For example, referring to FIG. 3, if the precision resistor is 200 ohms, then the bits calibrated to this on a ¼–50 ohm output stage could be used to obtain another desired impedance by scaling the devices in a second design. For example, if the devices were scaled to provide half the impedance, then a 25 ohm calibrated output stage could be obtained. The disadvantage of this is it will be less accurate.

While several embodiments and variations of the present invention for an output driver impedance calibration circuit are described in detail herein, it should be apparent that the disclosure and teachings of the present invention will suggest many alternative designs to those skilled in the art.

Having thus described our invention, what I claim as new, and desire to secure by Letters Patent is:

1. An output driver impedance calibration circuit comprising:
  an output driver circuit having an output stage with a base transistor device;
  a plurality of calibration transistor devices in the output stage of the output driver circuit;

means for activating in a time ordered sequence the base transistor device and then one at a time in the time ordered sequence each of the plurality of calibration transistor devices;

means for providing a target reference voltage;

a voltage comparator circuit for comparing the value of an output voltage of the output stage of the output driver circuit with the target reference voltage;

means for storing the states of the plurality of calibration transistor devices when the output voltage attains the target reference voltage, to preserve the states of the plurality of calibration transistor devices and to calibrate the output impedance of the output driver circuit to a target output impedance.

2. The circuit of claim 1, wherein an external precision resistor is connected to a power supply of the output driver circuit, and forms a voltage divider circuit with the output stage to form the output voltage of the output stage.

3. The circuit of claim 2, wherein the output driver circuit is on a chip, and the output stage is used to match a target impedance, and completes a circuit path from the power supply, through the external precision resistor, through activated calibration transistors in the output stage, to the chip ground.

4. The circuit of claim 2, wherein the external precision resistor is n, where n is a number, times larger than a target output impedance, and a 1/n sized output pull-down stage is used to match an n times target impedance.

5. The circuit of claim 1, wherein the output driver circuit forms a voltage divider circuit with the output stage to form the output voltage of the output stage.

6. The circuit of claim 5, wherein the output driver circuit is on a chip, and the output stage is used to match a target impedance, and completes a circuit path from a power supply on the chip, through the output driver circuit, through activated calibration transistor devices in the output stage, to the chip ground.

7. The circuit of claim 1, wherein the output driver impedance calibration circuit comprises:

a plurality of series of delay elements, one for each of the plurality of calibration transistor devices in the output stage, and an input update signal is propagated in series through each of the plurality of series of delay elements and turns on each of the plurality of calibration transistor devices in sequence, causing an output voltage at an output node of the output stage to change in a monotonically changing fashion;

the voltage comparator circuit has the monotonically changing output voltage as a first input voltage and the target reference voltage as a second input voltage, which is the voltage at which the output stage is within a desired tolerance of a target external precision impedance;

a set of latches, one for each of the plurality of transistor devices and when the voltage comparator circuit output voltage changes state, the gate voltage states of each of the plurality of transistor devices are stored in the set of latches.

8. The circuit of claim 7, wherein the output driver circuit is on a chip with other calibrated output driver circuits, and after the input update signal has propagated through the last delay element, the states of the set of latches are stored, and are transferred to gates of corresponding transistor devices of other calibrated output driver circuits on the same chip.

9. The circuit of claim 8, wherein the states of the set of latches are transferred to a second set of latches, from which they are transferred as outputs to the gates of corresponding transistor devices of the other calibrated output driver circuits on the same chip.

10. The circuit of claim 1, wherein the output driver circuit comprises a CMOS output driver stage which comprises a base PFET pull-up transistor device, a base NFET pull-down transistor device, and an output stage transistor R leading to an output node.

11. The circuit of claim 10, wherein a state of calibration is outputted to other output driver NFET pull-down output driver circuits and PFET pull-up output driver circuits on the same chip which require a calibrated output and have the same output impedance.

12. The circuit of claim 10, wherein the output driver circuit comprises a pull-up stage and a pull-down stage, and the output driver impedance calibration circuit comprises a pull-down calibration circuit, and a pull-up calibration circuit.

13. The circuit of claim 12, wherein an update input signal is propagated through a series of delay elements in each of the pull-down and pull-up calibration circuits to activate in sequence the base transistor device and the plurality of calibration transistor devices.

14. The circuit of claim 1, wherein the output driver circuit is on a chip with a plurality of corresponding output driver circuits, and the output of the output driver impedance calibration circuit is used to make a plurality of off chip driver characteristics, for the plurality of corresponding output driver circuits.

* * * * *